US008183602B2

(12) United States Patent
Tabata et al.

(10) Patent No.: US 8,183,602 B2
(45) Date of Patent: May 22, 2012

(54) NONVOLATILE SEMICONDUCTOR MEMORY DEVICE INCLUDING VIA-HOLES CONTINUOUSLY FORMED THROUGH PLURAL CELL ARRAY LAYERS

(75) Inventors: Hideyuki Tabata, Kawasaki (JP); Eiji Ito, Yokohama (JP); Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

(21) Appl. No.: 12/275,682

(22) Filed: Nov. 21, 2008

(65) Prior Publication Data

US 2009/0134432 A1 May 28, 2009

(30) Foreign Application Priority Data

Nov. 22, 2007 (JP) ................. 2007-303668

(51) Int. Cl.
*H01L 23/52* (2006.01)
(52) U.S. Cl. ........ 257/211; 257/774; 257/775; 257/776; 257/E23.145; 257/E23.151; 257/E23.152
(58) Field of Classification Search .......... 257/211, 257/E23.145, E23.151, E23.143, 774, 775
See application file for complete search history.

(56) References Cited

U.S. PATENT DOCUMENTS

| 6,917,532 | B2 * | 7/2005 | Van Brocklin et al. .......... 365/51 |
| 7,291,878 | B2 | 11/2007 | Stipe |
| 2006/0197115 | A1 * | 9/2006 | Toda ............................. 257/248 |
| 2007/0222076 | A1 * | 9/2007 | Fukasawa et al. ............ 257/751 |

OTHER PUBLICATIONS

U.S. Appl. No. 12/879,281, filed Sep. 10, 2010, Ishibashi, et al.

\* cited by examiner

*Primary Examiner* — Robert Huber
(74) *Attorney, Agent, or Firm* — Oblon, Spivak, McClelland, Maier & Neustadt, L.L.P.

(57) ABSTRACT

A nonvolatile semiconductor memory device comprises a semiconductor substrate; a cell array block formed on the semiconductor substrate and including plural stacked cell array layers each with a plurality of first lines, a plurality of second lines crossing the plurality of first lines, and memory cells connected at intersections of the first and second lines between both lines; and a plurality of via-holes extending in the stacked direction of the cell array layers to individually connect the first or second line in the each cell array layer to the semiconductor substrate. The via-holes are formed continuously through the plural cell array layers, and multiple via-holes having equal lower end positions and upper end positions are connected to the first or second lines indifferent cell array layers.

15 Claims, 14 Drawing Sheets

FIG. 6
(a) Schottky Structure
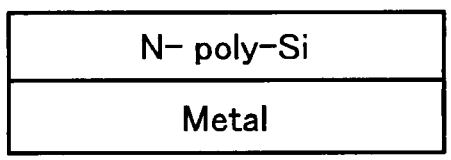
(d) MIM Structure
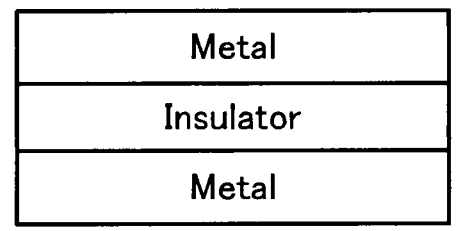
(b) PN Structure
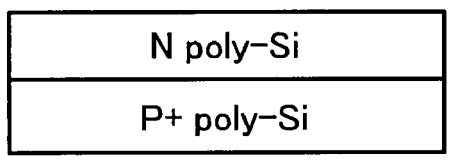
(e) SIS Structure
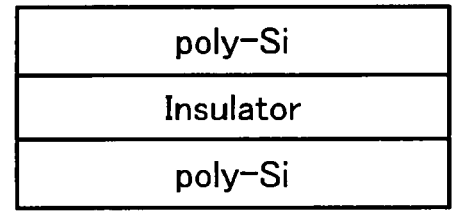
(c) PIN Structure
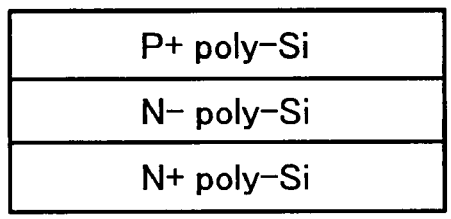

NONVOLATILE SEMICONDUCTOR MEMORY DEVICE INCLUDING VIA-HOLES CONTINUOUSLY FORMED THROUGH PLURAL CELL ARRAY LAYERS

CROSS-REFERENCE TO RELATED APPLICATION

This application is based upon and claims the benefit of priority from the prior Japanese Patent Application No. 2007-303668, filed on Nov. 22, 2007, the entire contents of which are incorporated herein by reference.

BACKGROUND OF THE INVENTION

1. Field of the Invention

The present invention relates to a multilayer-structured nonvolatile semiconductor device with stacked memory cells of the cross point type and method of manufacturing the same.

2. Description of the Related Art

Electrically erasable programmable nonvolatile memories include a flash memory as well known in the art, which comprises a memory cell array of NAND-connected or NOR-connected memory cells having a floating gate structure. A ferroelectric memory is also known as a nonvolatile fast random access memory.

On the other hand, technologies of patterning memory cells much finer include a resistance variable memory, which uses a variable resistor in a memory cell as proposed. Known examples of the variable resistor include a phase change memory element that varies the resistance in accordance with the variation in crystal/amorphous states of a chalcogenide compound; an MRAM element that uses a variation in resistance due to the tunnel magneto-resistance effect; a polymer ferroelectric RAM (PFRAM) memory element including resistors formed of a conductive polymer; and a ReRAM element that causes a variation in resistance on electrical pulse application (Patent Document 1: JP 2006-344349A, paragraph 0021).

The resistance variable memory may configure a memory cell with a serial circuit of a Schottky diode and a resistance variable element in place of the transistor. Accordingly, it can be stacked easier and three-dimensionally structured to achieve much higher integration advantageously (Patent Document 2: JP 2005-522045A).

The above-described multilayer-structured memory of prior art requires formation of via-holes extending vertically to connect word and bit lines in each layer to a semiconductor substrate, layer by layer, which requires process steps of forming via-holes and increases the cost.

SUMMARY OF THE INVENTION

In an aspect the present invention provides a nonvolatile semiconductor memory device, comprising: a semiconductor substrate; a cell array block formed on the semiconductor substrate and including plural stacked cell array layers each with a plurality of first lines, a plurality of second lines crossing the plurality of first lines, and memory cells connected at intersections of the first and second lines between both lines; and a plurality of via-holes extending in the stacked direction of the cell array layers to individually connect the first or second line in the each cell array layer to the semiconductor substrate, wherein the via-holes are formed continuously through the plural cell array layers, and multiple via-holes having equal beginning positions and terminating positions are connected to the first or second lines in different cell array layers.

In another aspect the present invention provides a nonvolatile semiconductor memory device, comprising: a semiconductor substrate; a cell array block formed on the semiconductor substrate and including plural stacked cell array layers each with a plurality of first lines, a plurality of second lines crossing the plurality of first lines, and memory cells connected at intersections of the first and second lines between both lines; and a plurality of via-holes extending in the stacked direction of the cell array layers to individually connect the first or second line in the each cell array layer to the semiconductor substrate, wherein the via-holes are formed continuously through the plural cell array layers, and multiple via-holes having equal lower end positions and upper end positions include some via-holes connected to the first or second line in a certain cell array layer and other via-holes connected to the first or second line in a cell array layer different from the certain cell array layer.

In another aspect the present invention provides a method of manufacturing nonvolatile semiconductor memory devices, comprising: forming plural cell array layers in multiple layers on a semiconductor substrate to form a cell array block, each cell array layer including a plurality of first lines, a plurality of second lines crossing the plurality of first lines, and memory cells connected at intersections of the first and second lines between both lines; forming penetrated holes simultaneously, together with formation of the cell array block, after formation of plural cell array layers, the penetrated holes penetrating the plural cell array layers and penetrating the first or second lines in different cell array layers; and filling the simultaneously formed penetrated holes with a conductive material, thereby forming a plurality of via-holes extending in the stacked direction of the cell array layers to individually connect the first or second line in the each cell array layer to the semiconductor substrate.

BRIEF DESCRIPTION OF THE DRAWINGS

FIG. 6 is a schematic cross-sectional view showing a non-ohmic element example in the same embodiment.

DETAILED DESCRIPTION OF THE EMBODIMENTS

The embodiments of the invention will now be described with reference to the drawings.
[First Embodiment]
[Entire Configuration]

Figure 1:
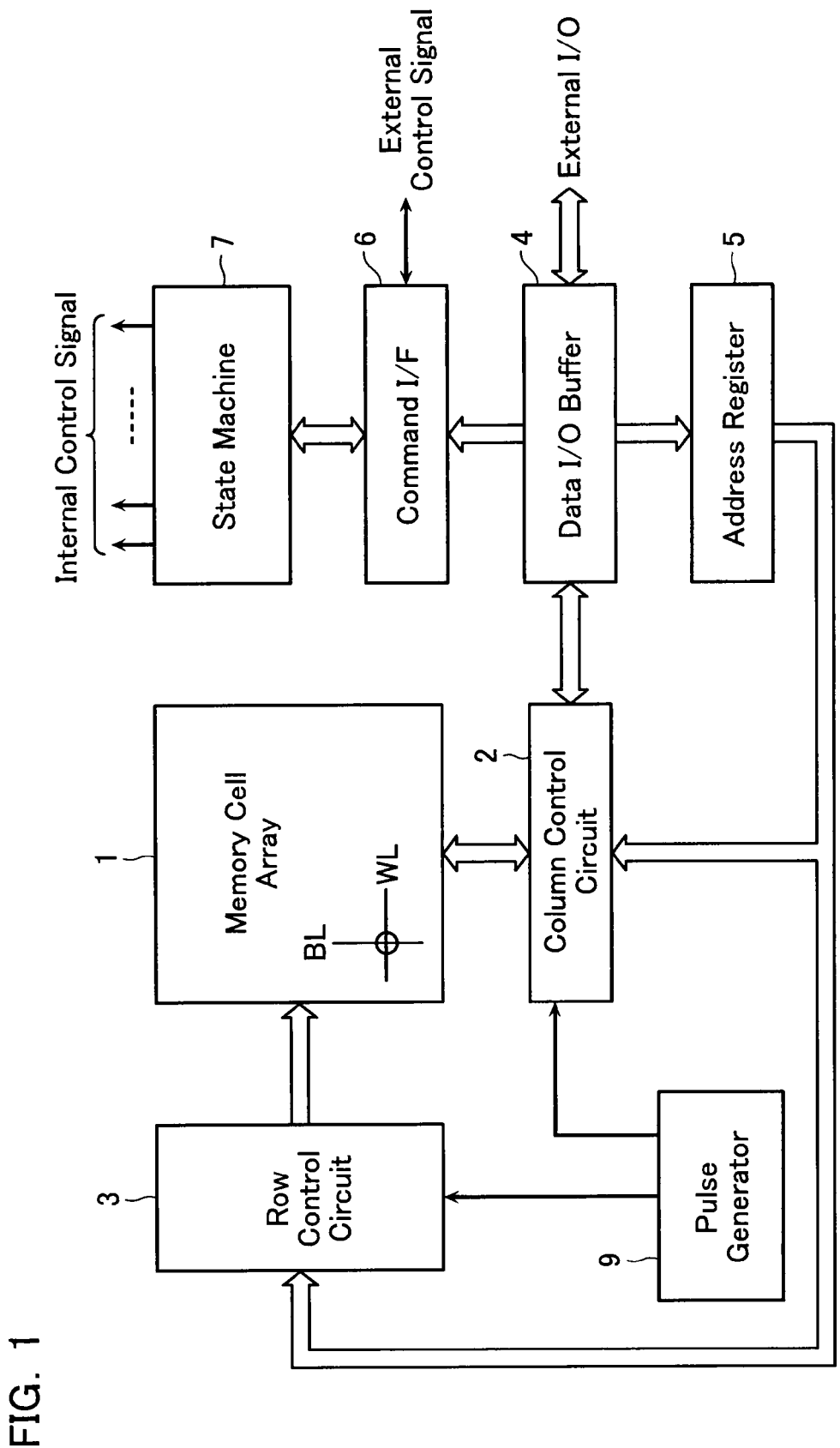
FIG. 1 is a block diagram of a nonvolatile memory according to a first embodiment of the present invention.

FIG. 1 is a block diagram of a nonvolatile memory according to a first embodiment of the present invention.

The nonvolatile memory comprises a memory cell array 1 of memory cells arranged in matrix, each memory cell including a later-described ReRAM (variable resistor). A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell.

A data I/O buffer 4 is connected to an external host, not shown, via an I/O line to receive write data, receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent via an address register 5 to the column control circuit 2 and the row control circuit 3. A command fed from the host to the data I/O buffer 4 is sent to a command interface 6. The command interface 6 receives an external control signal from the host and decides whether the data fed to the data I/O buffer 4 is write data, a command or an address. If it is a command, then the command interface 6 transfers it as a received command signal to a state machine 7. The state machine 7 manages the entire nonvolatile memory to receive commands from the host to execute read, write, erase, and execute data I/O management. The external host can also receive status information managed by the state machine 7 and decides the operation result. The status information is also utilized in control of write and erase.

The state machine 7 controls the pulse generator 9. Under this control, the pulse generator 9 is allowed to provide a pulse of any voltage at any timing. The pulse formed herein can be transferred to any line selected by the column control circuit 2 and the row control circuit 3.

Peripheral circuit elements other than the memory cell array 1 can be formed in a Si substrate immediately beneath the memory cell array 1 formed in a wiring layer. Thus, the chip area of the nonvolatile memory can be made almost equal to the area of the memory cell array 1.
[Memory Cell Array and Peripheral Circuits]

Figure 2:
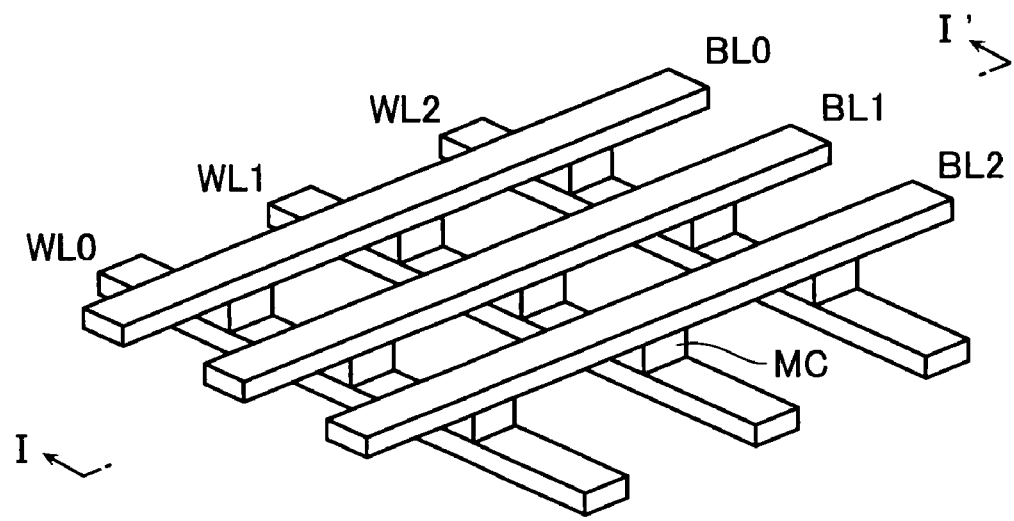
FIG. 2 is a perspective view of part of a memory cell array in the nonvolatile memory according to the same embodiment.
Figure 3:
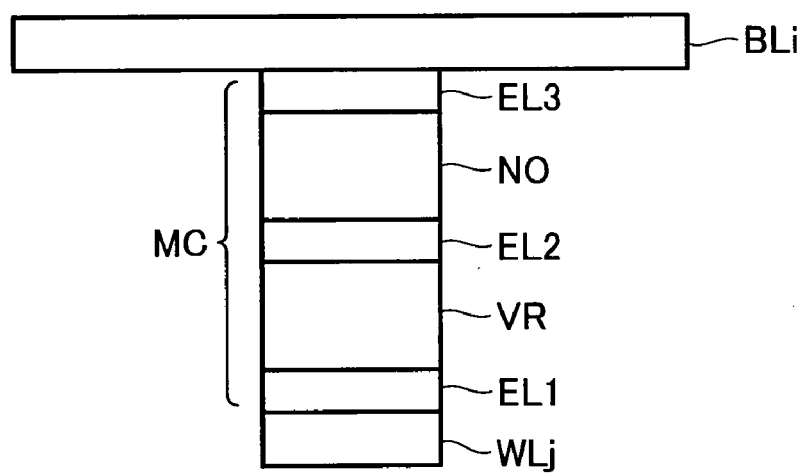
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines orbit lines BL0-BL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistor VR and a non-ohmic element NO as shown in FIG. 3.

The variable resistor VR can vary the resistance through current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed.

The variable resistor VR may include one that comprises a composite compound containing cations of a transition element and varies the resistance through migration of cations (ReRAM).

Figure 4:
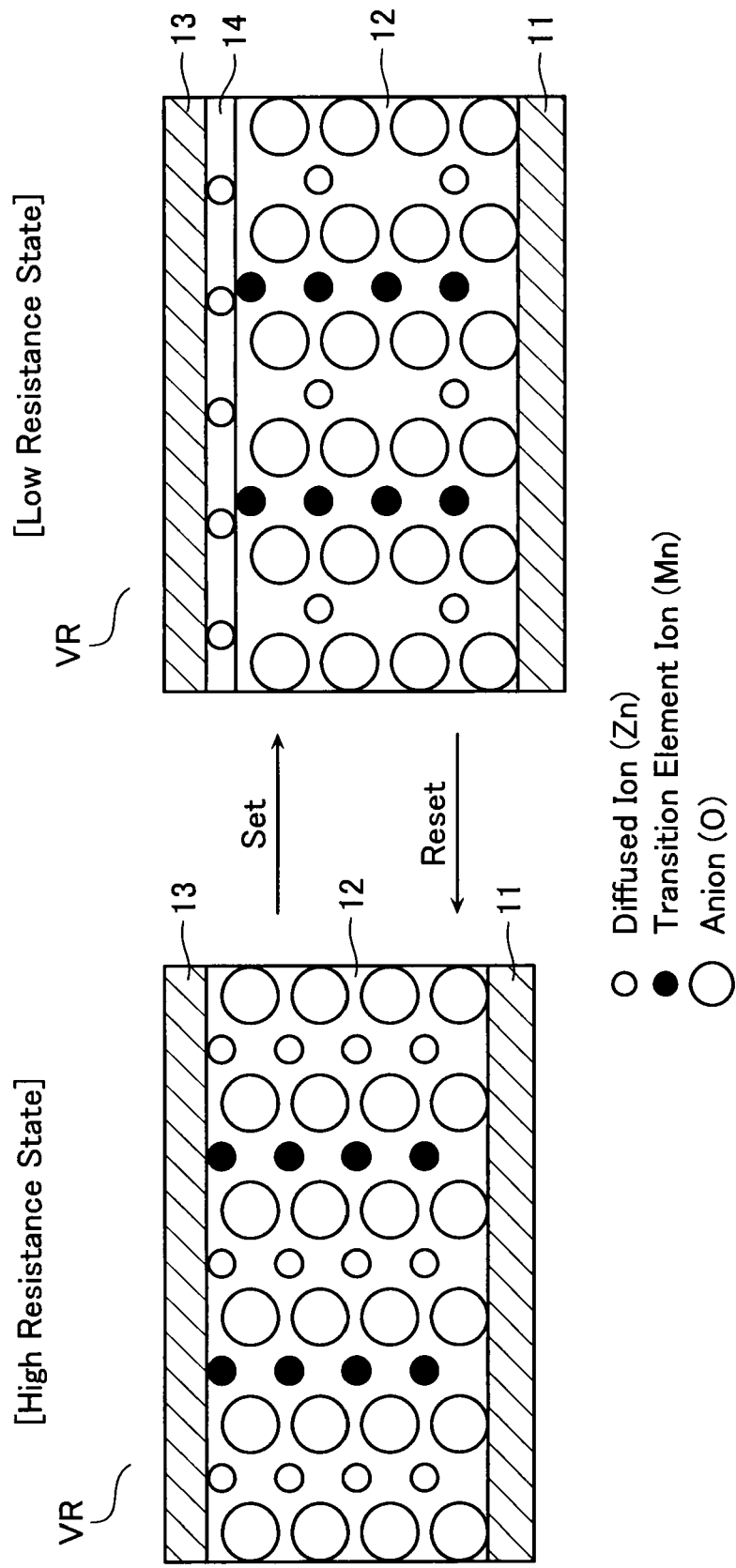
FIG. 4 is a schematic cross-sectional view showing a variable resistor example in the same embodiment.
Figure 5:
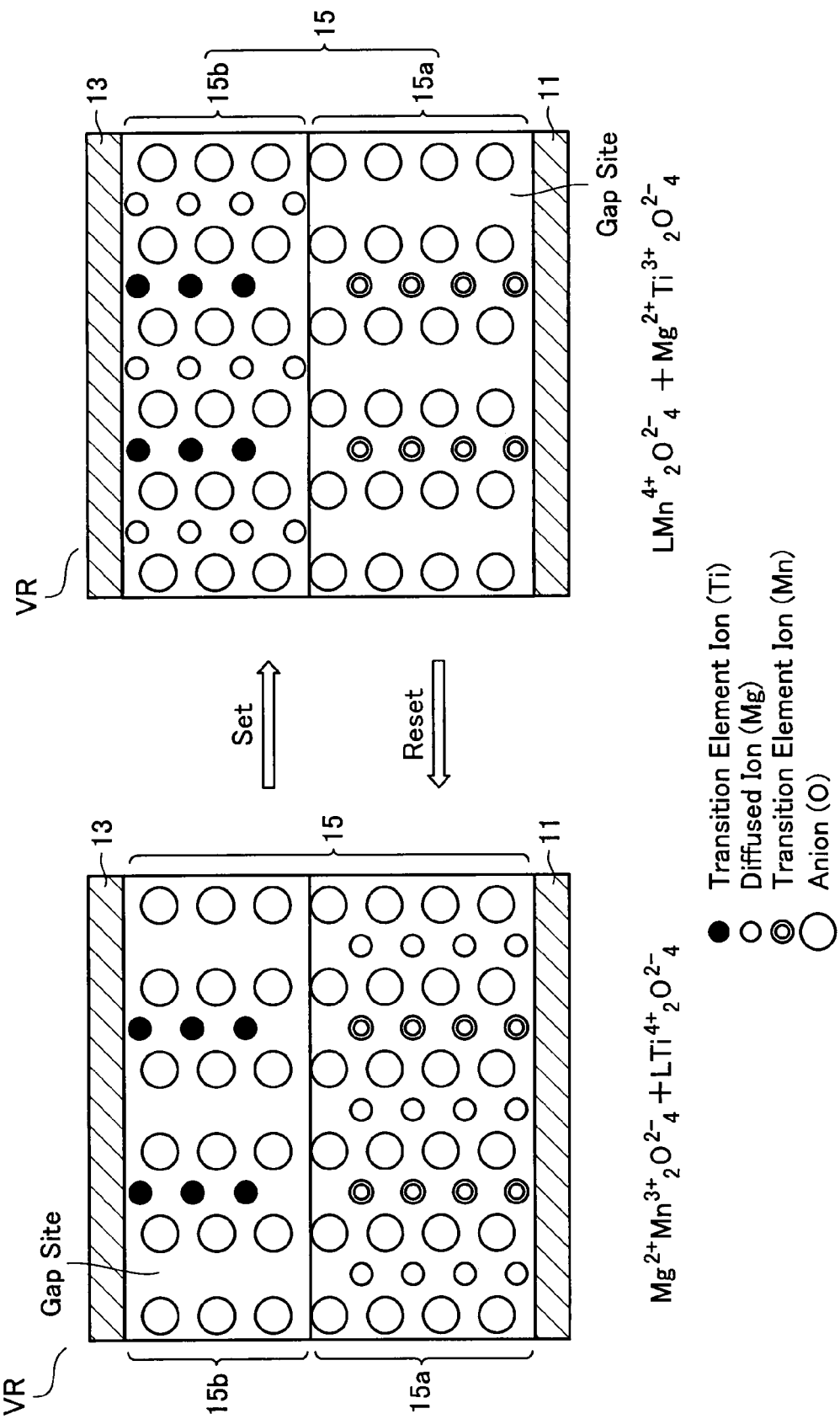
FIG. 5 is a schematic cross-sectional view showing another variable resistor example in the same embodiment.

FIGS. 4 and 5 show examples of the variable resistor. The variable resistor VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_2MO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On data reading, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow resetting.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xM1_yX1_z$. The second compound layer 15b is arranged on the side close to the electrode layer 13 and has gap sites capable of accommodating cation elements from the first compound layer 15a.

In the example of FIG. 5, A comprises Mg, M1 comprises Mn, and X1 comprises O in the first compound layer 15a. The second compound layer 15b contains Ti shown with black circles as transition element ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

In such the variable resistor VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes gap sites capable of accommodating diffused ions. Accordingly, the diffused ions moved from the first compound layer 15a are trapped in the gap sites. Therefore, the valence of the transition element ion in the first compound layer 15a increases while the valence of the transition element ion in the second compound layer 15b decreases. In the initial state, the first and second compound layers 15a, 15b may be in the high-resistance state. In such the case, migration of part of diffused ions in the first compound layer 15a therefrom into the second compound layer 15b generates conduction carriers in the crystals of the first and second compounds, and thus both have electric conduction. The programmed state (low-resistance state) may be reset to the erased state (high-resistance state) by supplying a large current flow in the recording layer 15 for a sufficient time for Joule heating to facilitate the oxidation reduction reaction in the recording layer 15, like in the preceding example. Application of an electric field in the opposite direction from that at the time of setting may also allow reset.

The non-ohmic element NO may include various diodes such as (a) a Schottky diode, (b) a PN-junction diode, (c) a PIN diode and may have (d) a MIM (Metal-Insulator-Metal) structure, and (e) a SIS (Silicon-Insulator-Silicon) structure as shown in FIG. 6. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation.

Figure 7:
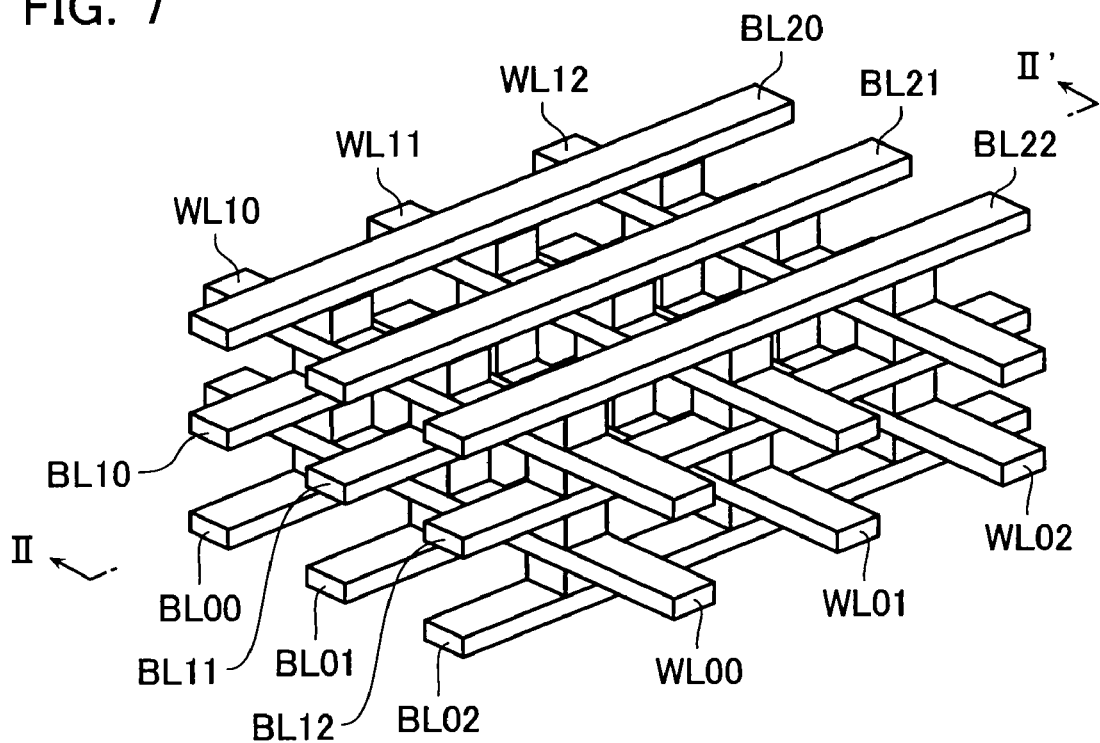
FIG. 7 is a perspective view of part of a memory cell array according to another embodiment of the present invention.
Figure 8:
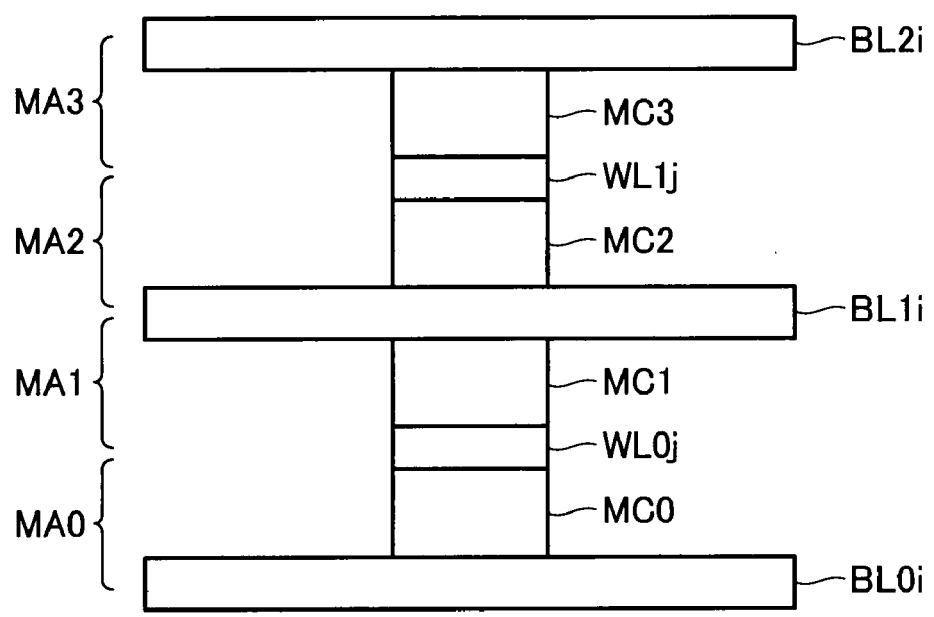
FIG. 8 is a cross-sectional view of one memory cell taken along II-II' line and seen from the direction of the arrow in FIG. 7.

Plural such memory structures described above may be stacked to form a three-dimensional structure as shown in FIG. 7. FIG. 8 is a cross-sectional view showing an II-II' section in FIG. 7. The shown example relates to a memory cell array of a 4-layer structure having cell array layers MA0-MA3. A word line WL0j is shared by an upper and a lower memory cells MC0, MC1. A bit line BL1i is shared by an upper and a lower memory cells MC1, MC2. A word line WL1j is shared by an upper and a lower memory cells MC2, MC3. In place of the line/cell/line/cell repetition, an interlayer insulator may be interposed as a line/cell/line/interlayer-insulator/line/cell/line between cell array layers.

The memory cell array 1 may be divided into MATs of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 9:
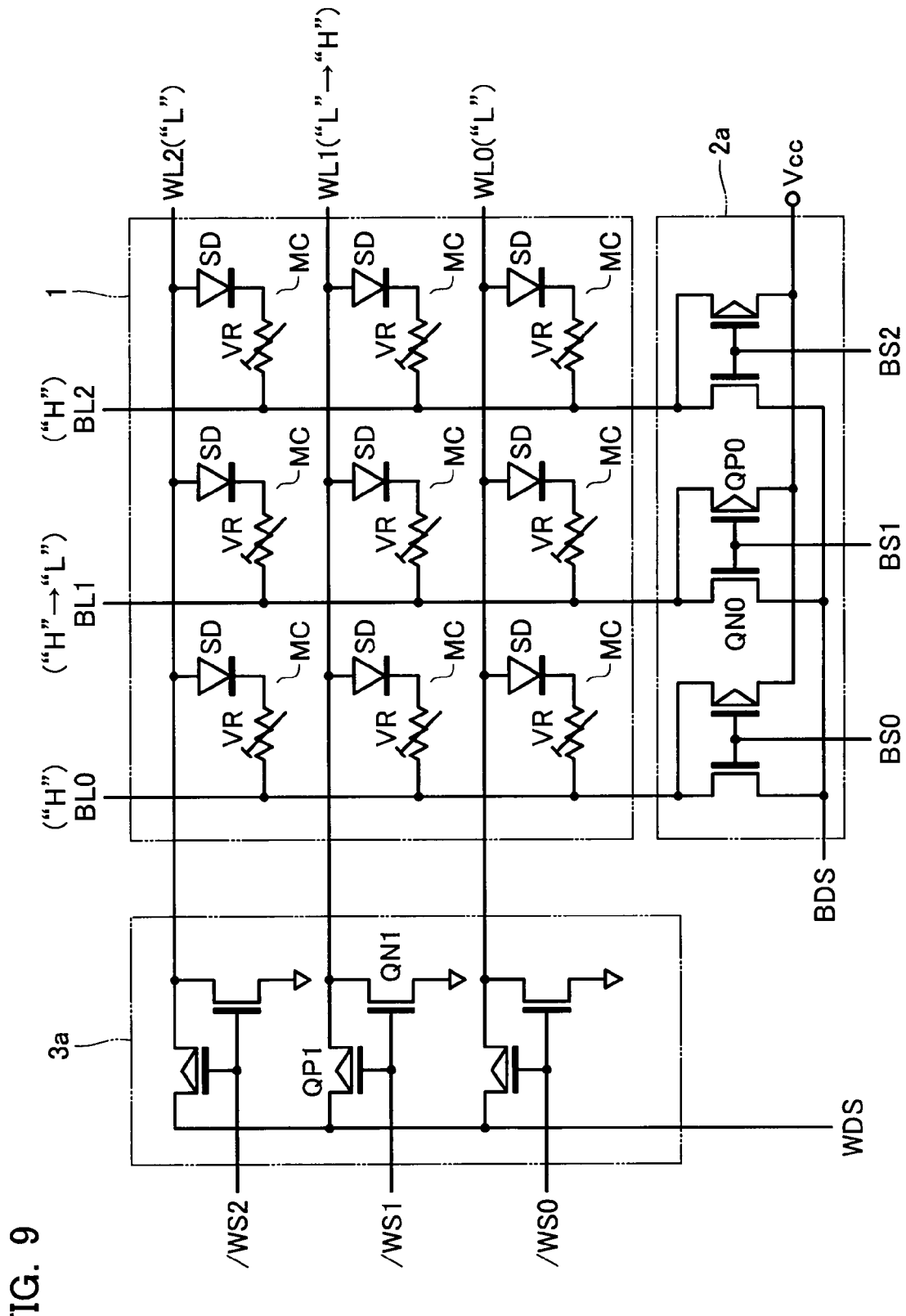
FIG. 9 is a circuit diagram of the memory cell array and peripheral circuits thereof according to the same embodiment.

FIG. 9 is a circuit diagram of the memory cell array 1 using a diode SD as the non-ohmic element NO and peripheral circuits thereof. For simplicity, the description advances on the assumption that the memory has a single-layered structure.

In FIG. 9, the diode contained in the memory cell MC has an anode connected to the word line WL and a cathode connected to the bit line BL via the variable resistor VR. Each bit line BL has one end connected to a selection circuit 2a, which is part of the column control circuit 2. Each word line WR has one end connected to a selection circuit 3a, which is part of the row control circuit 3.

The selection circuit 2a includes a selection PMOS transistor QP0 and a selection NMOS transistor QN0, provided at each bit line BL, of which gates and drains are commonly connected. The selection PMOS transistor QP0 has a source connected to a high potential source Vcc. The selection NMOS transistor QN0 has a source connected to a bit-line side drive sense line BDS, which is used to apply a write pulse and supply a detection current at the time of data read. The transistors QP0, QN0 have a common drain connected to the bit line BL, and a common gate supplied with a bit-line selection signal BSi for selecting each bit line BL.

The selection circuit 3a includes a selection PMOS transistor QP1 and a selection NMOS transistor QN1, provided at each word line WL, of which gates and drains are commonly connected. The selection PMOS transistor QP1 has a source connected to a word-line side drive sense line WDS, which is used to apply a write pulse and supply a detection current at the time of data read. The selection NMOS transistor QN1 has a source connected to the low potential source Vss. The transistors QP1, QN1 have a common drain connected to the word line WL and a common gate supplied with a word-line selection signal /WSi for selecting each word line WL.

The example shown above is suitable for selecting the memory cells individually. In contrast, in batch read of data from plural memory cells MC connected to the word line WL, sense amplifiers are arranged individually for the bit lines BL0-BL2, and the bit lines BL0-BL2 are connected to the sense amplifiers individually by the bit-line selection signal BS via the selection circuit 2a.

The memory cell array 1 may include a diode SD of which polarity is inverted from the circuit shown in FIG. 7 to supply a current flow from the bit line BL to the word line WL.

Figure 10:
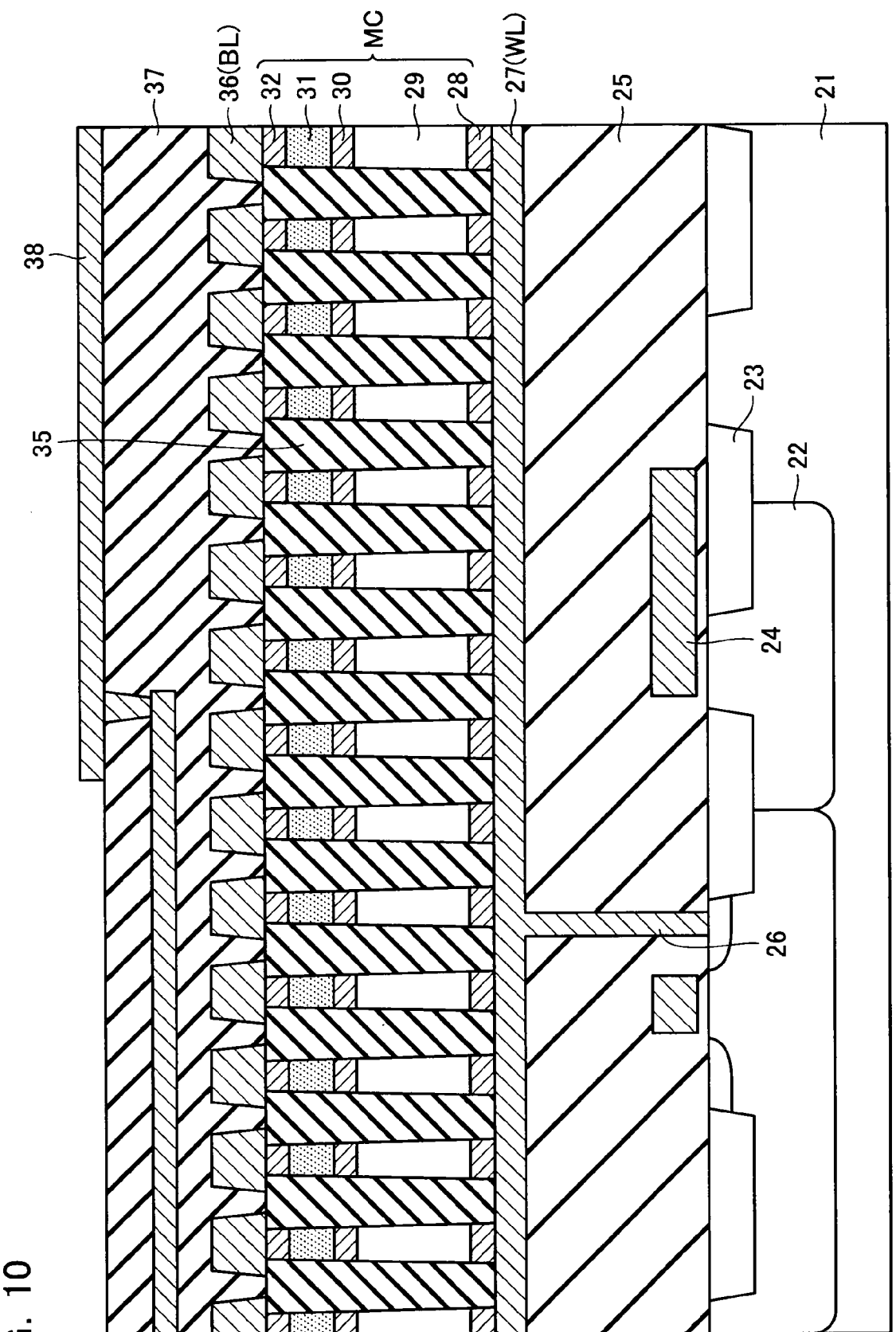
FIG. 10 is a cross-sectional view of the nonvolatile memory according to the same embodiment.
Figure 11:
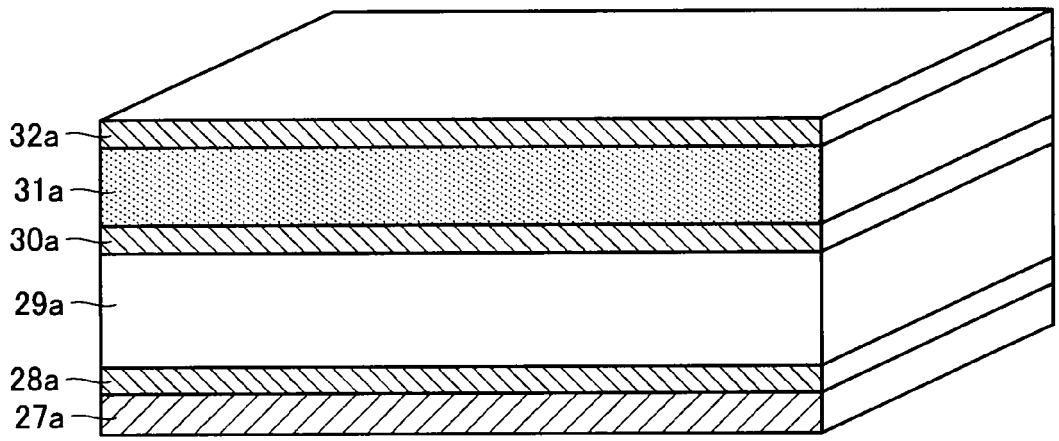
FIG. 11 is a perspective view showing a step of forming the upper layer portion in the nonvolatile memory according to the same embodiment in order of step.

FIG. 10 is a cross-sectional view of the nonvolatile memory including the above-described memory structure in one stage. There is provided a silicon substrate 21 with a well 22 formed therein, on which an impurity-diffused layer 23 and a gate electrode 24 of a transistor contained in a peripheral circuit are formed, on which a first interlayer insulator 25 is deposited. The first interlayer insulator 25 includes a via-hole 26 appropriately formed therethrough to the surface of the silicon substrate 21. On the first interlayer insulator 25, a first metal 27 is formed of a low-resistance metal such as W to form the first line or word line WL in the memory cell array. In an upper layer above the first metal 27, a barrier metal 28 is formed. In a lower layer below the first metal 27, a barrier metal may be formed. These barrier metals may be formed of both or one of Ti and TiN. Above the barrier metal 28, a non-ohmic element 29 such as a diode is formed. On the non-ohmic element 29, a first electrode 30, a variable resistor 31 and a second electrode 32 are formed in this order, thereby configuring a memory cell MC including the barrier metal 28 through the second electrode 32. A barrier metal may be interposed beneath the first electrode 30 and above the second electrode 32. A barrier metal, and an adhesive layer or the like may be interposed below the second electrode 32 and on the first electrode 30. A second interlayer insulator 34 and a third interlayer insulator 35 are buried between the memory cell MC and an adjacent memory cell MC (the second interlayer insulator 34 is not shown in FIG. 10). On the memory cells MC in the memory cell array, a second metal 36 is formed to configure a second line or bit line BL extending in the direction perpendicular to the word line WL. A fourth interlayer insulator 37 and a metal wiring layer 38 are formed thereon to complete the variable resistance memory or nonvolatile memory. A multi-layered structure may be realized by stacking the barrier metal 28 through the second electrode 32 and forming the second and third interlayer insulators 34, 35 between the memory cells MC, repeatedly by the number of layers required.

[Method of Manufacturing Single-Layered Cell Array]

A method of manufacturing the nonvolatile memory shown in FIG. 10 according to the present embodiment is described next.

First, a FEOL (Front End of Line) process for forming transistors and so forth to form necessary peripheral circuits on the silicon substrate 21 is executed, and then the first interlayer insulator 25 is deposited thereon. The via-hole 26 is formed as well in this step.

Subsequently, the upper layer portion above the first metal 27 is formed.

FIGS. 11-16 are perspective views showing steps of forming the upper layer portion in order of step. Referring to FIGS. 11-16 appropriately, processes of forming the upper layer portion are described.

Once the first interlayer insulator 25 and the via-hole 26 are formed as described above, deposition thereon of a layer 27a turned into the first metal 27 in the memory cell array, formation of a layer 28a turned into the barrier metal 28, deposition of a layer 29a turned into the non-ohmic element 29, deposition of a layer 30a turned into the first electrode 30, deposition of a layer 31a turned into the variable resistor 31, and deposition of a layer 32a turned into the second electrode 32 are executed sequentially. Through the above steps, the stacked body of the upper layer portion shown in FIG. 11 can be formed.

Figure 12:
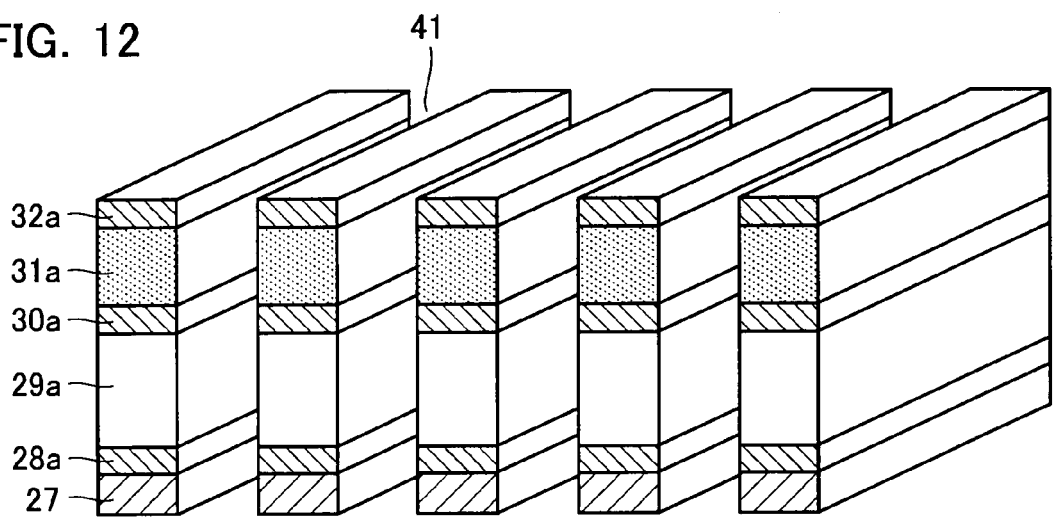
FIG. 12 is a perspective view showing a step of forming the upper layer portion in the nonvolatile memory according to the same embodiment in order of step.

Subsequently, a hard mask such as TEOS, not shown, is formed on the upper surface of the stacked body, and a first anisotropic etching is executed with this mask to form first trenches 41 along the word line WL as shown in FIG. 12 to separate the stacked body.

Figure 13:
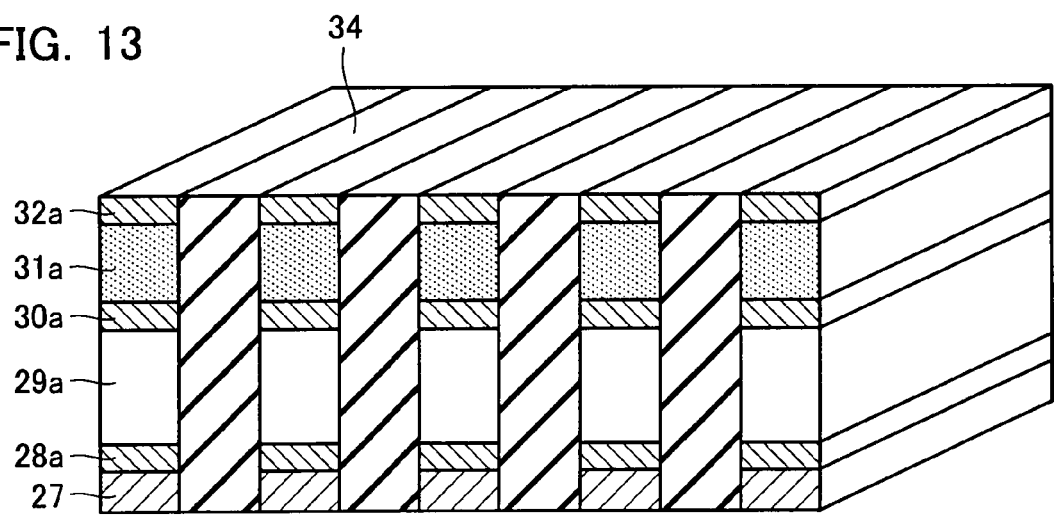
FIG. 13 is a perspective view showing a step of forming the upper layer portion in the nonvolatile memory according to the same embodiment in order of step.

Next, the second interlayer insulator 34 is buried in the trench 41. For the second interlayer insulator 34, a suitable material has excellent insulation, a low capacity and an excellent burial property. Subsequently, a process of CMP or the like is applied in planarization to remove extra portions from the second interlayer insulator 34 and expose the upper electrode 32. A cross-sectional view after the planarization is shown in FIG. 13.

Figure 14:
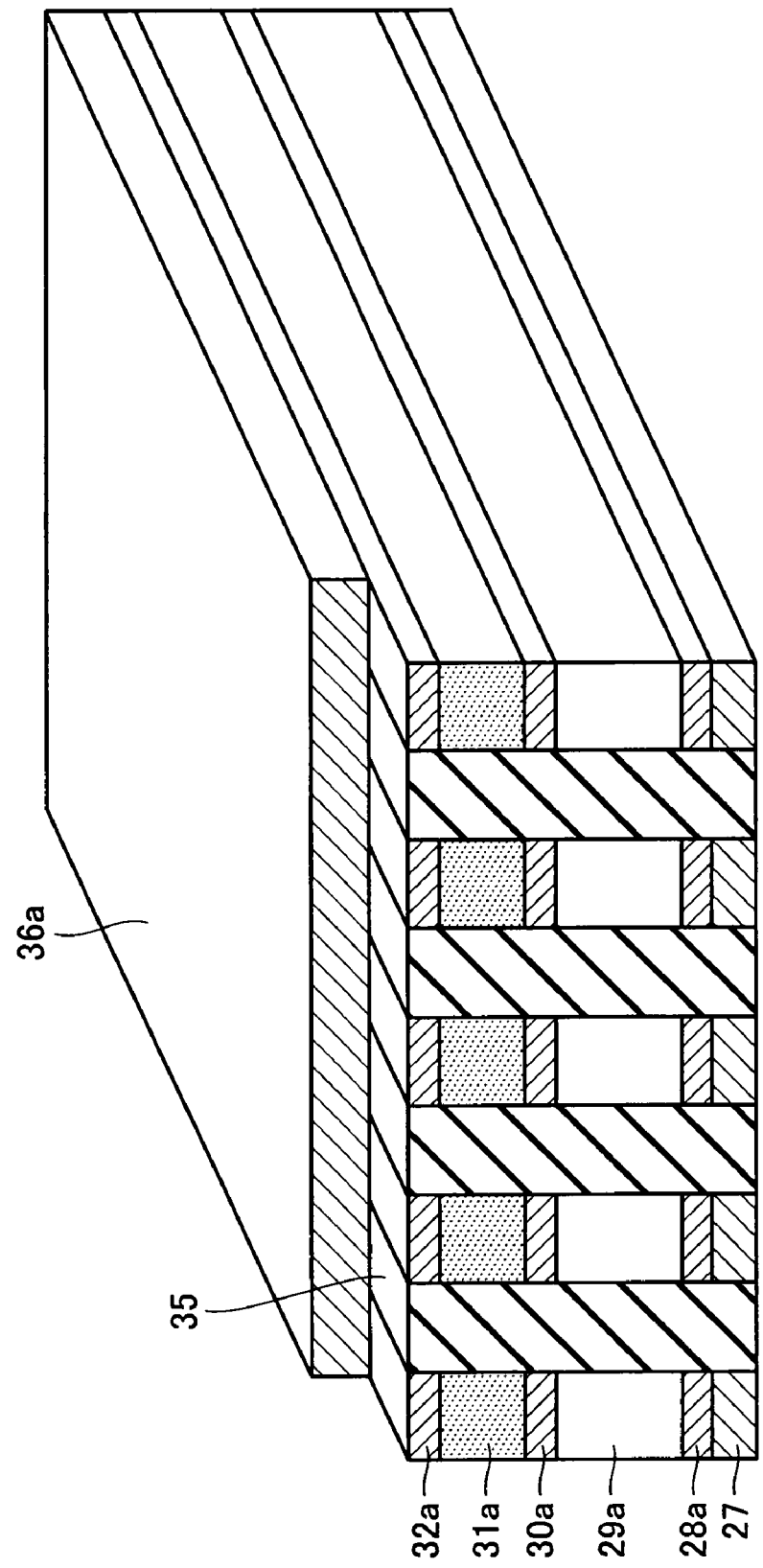
FIG. 14 is a perspective view showing a step of forming the upper layer portion in the nonvolatile memory according to the same embodiment in order of step.

A layer 36a such as tungsten turned into the second metal 36 is stacked over the planarized portion after CMP. The state after this step is shown in FIG. 14.

Figure 15:
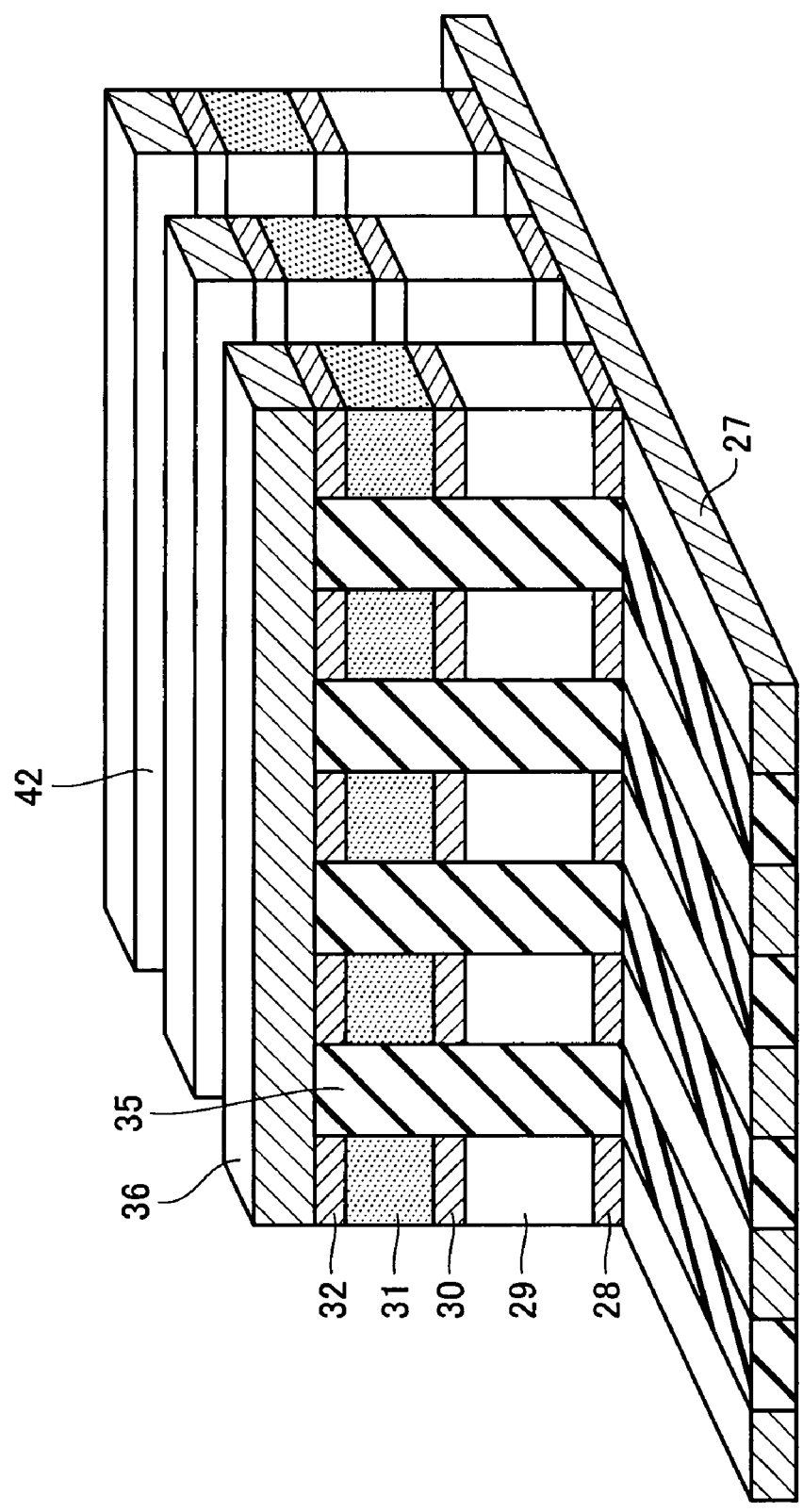
FIG. 15 is a perspective view showing a step of forming the upper layer portion in the nonvolatile memory according to the same embodiment in order of step.
Figure 16:
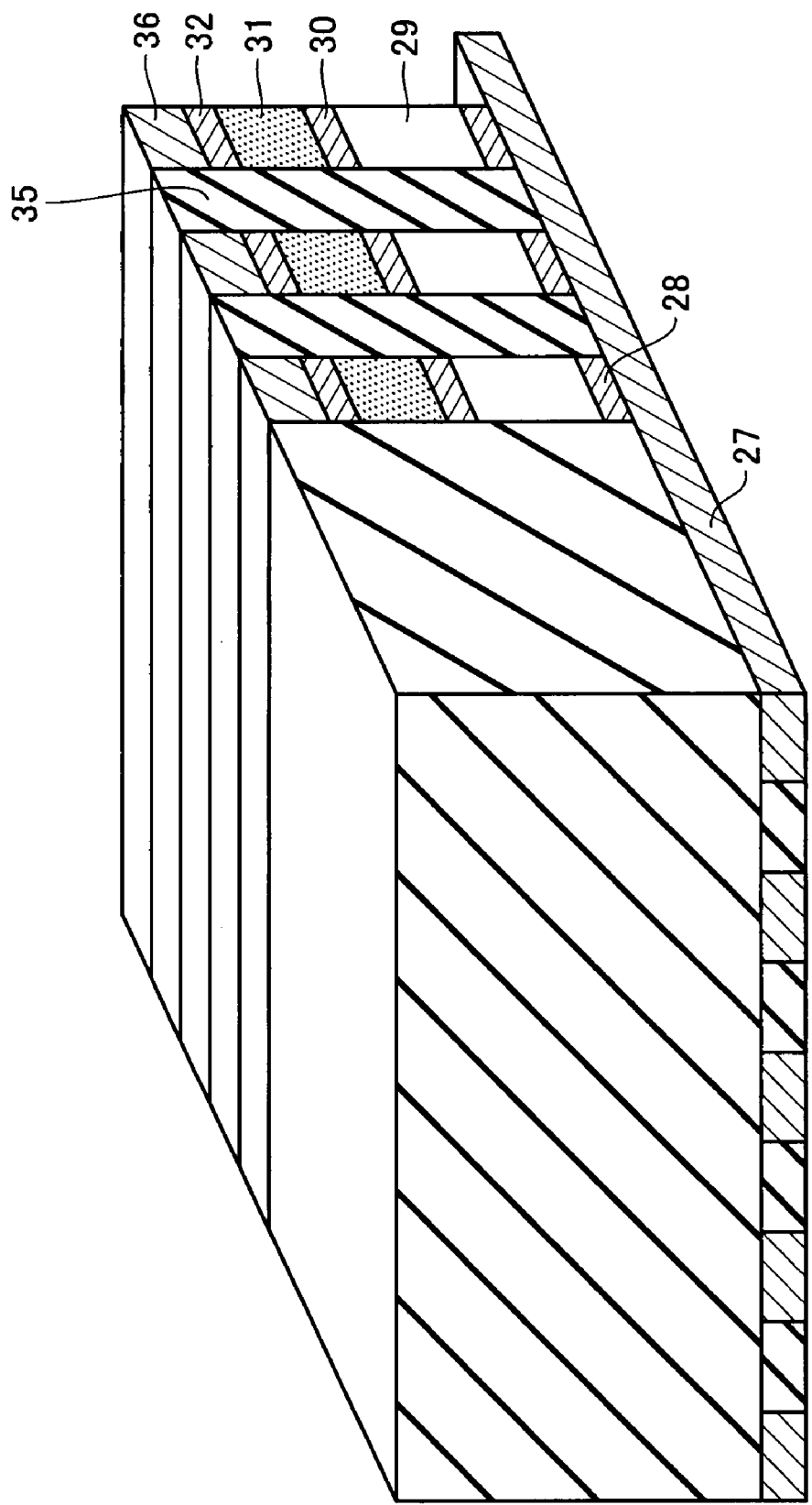
FIG. 16 is a perspective view showing a step of forming the upper layer portion in the nonvolatile memory according to the same embodiment in order of step.

Thereafter, a hard mask such as TEOS is formed on the layer 36a, and a second etching is executed with L/S in the direction crossing the first etching, thereby forming trenches 42 along the word line WL orthogonal to the bit line BL as shown in FIG. 15. At the same time, the memory cells MC separated in pillar shapes are formed at cross-points of the bit lines BL and the word lines WL in a self-aligned manner. Subsequently, the third interlayer insulator 35 is buried and then the third interlayer insulator 35 is planarized, thereby forming the memory array layer of the cross-point type as shown in FIG. 16.

Thus, through stacking flat films and patterning them twice with orthogonal L/S, such the cross-point cells can be formed in a self-aligned manner without any misalignment.

The formation of the above stacked structure can be repeated to complete the memory cell array of the multi-layered cross-point type.

[First Embodiment]

Figure 17:
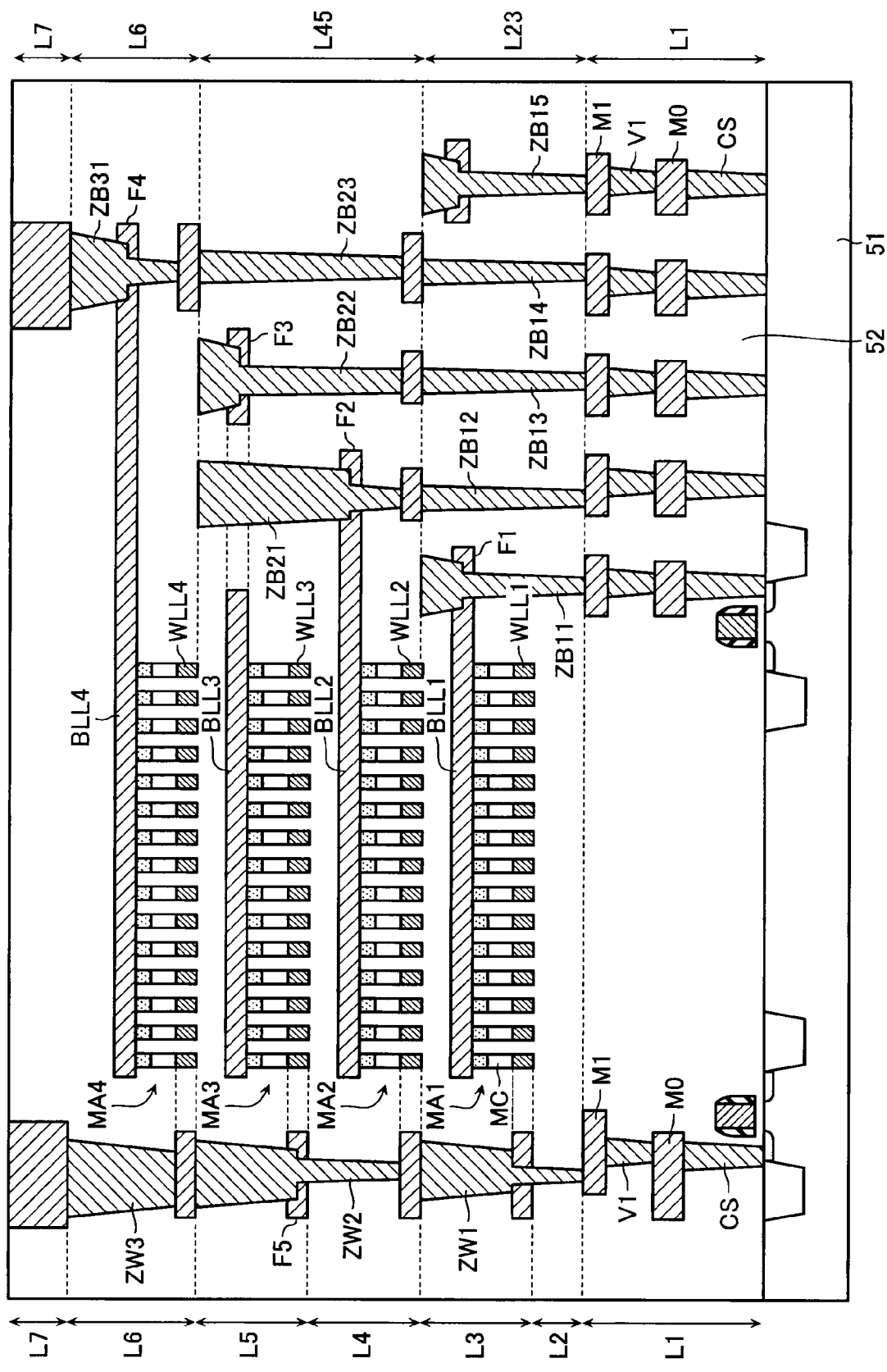
FIG. 17 is a cross-sectional view of the major part of the nonvolatile memory according to the same embodiment.

FIG. 17 is a cross-sectional view showing a memory cell part in a nonvolatile semiconductor memory device according to one embodiment of the present invention.

The present embodiment is intended to reduce the number of the steps of processing the via-holes in configuring the above-described plural memory cell arrays in multiple layers.

As shown, an upper layer portion formed on a silicon substrate 51 includes 7 stacked layers roughly classified into a first layer L1 through a seventh layer L7. These 7 layers include a second layer L2 and a third layer L3, which are collectively represented by a second/third layer L23, and a fourth layer L4 and a fifth layer L5, which are collectively represented by a fourth/fifth layer L45.

In the third layer L3 through the sixth layer L6, cell array layers MA1-MA4 are formed. Each cell array layer MAi (i=1-4) includes a plurality of first lines or word lines WLLi (or bit lines BLLi) extending in parallel, a plurality of second lines or bit lines BLLi (or word lines WLLi) extending in parallel in a direction perpendicular to the word lines WLLi, and memory cells MC each including a variable resistor VR and a non-ohmic element ON and connected at intersections of these lines.

From the second layer to the seventh layer, via-holes ZW1, ZW2, ZW3 are formed as common lines and word lines WLL1-WLL4 are connected to these via-holes ZW1, ZW2, ZW3. The first layer L1 includes via-holes CS, V1 and metal lines M0, M1 formed therein, which configure a lower wiring portion, to lead the via-hole ZW1 to the silicon substrate 51. Therefore, the via-holes ZW1-ZW3 are connected to peripheral circuits such as a row decoder formed in the silicon substrate 51 via the lower wiring portion. The via-holes ZW1-ZW3 and the lower wiring portion configure a word-line lead.

On the other hand, a bit-line lead is configured as follows. The bit line BLL1 in the cell array layer MA1 is connected via the via-hole ZB11 penetrating the second/third layer L23 and via the lower wiring portion to the silicon substrate 51. The bit line BLL2 in the cell array layer MA2 is connected via the via-holes ZB21, ZB12 penetrating the fourth/fifth layer L45 and the second/third layer L23 and via the lower wiring portion to the silicon substrate 51. The bit line BLL3 in the cell array layer MA3 is also connected via the via-holes ZB22, ZB13 penetrating the fourth/fifth layer L45 and the second/third layer L23 and via the lower wiring portion to the silicon substrate 51. The bit line BLL4 in the cell array layer MA4 is connected via the via-holes ZB31, ZB23, ZB14, ZB11 penetrating the sixth layer L6, the fourth/fifth layer L45 and the second/third layer L23 and via the lower wiring portion to the silicon substrate 51.

It is important that the via-holes ZW1, ZB11-ZB15 penetrating the second/third layer L23 are formed in the same step, the via-holes ZW2, ZB21-ZB23 penetrating the fourth/fifth layer L45 are formed in the same step, and the via-holes ZW3, ZB31 penetrating the sixth layer L6 are formed in the same step. Therefore, as for the word line WLL3 and the bit lines BLL1, BLL2, BLL3, BLL4 penetrating the via-holes ZW2, ZB11, ZB15, ZB21, ZB22, ZB31 have respective fringes F5, F1, F2, F3, F4, through which via penetration holes are formed.

Figure 18:
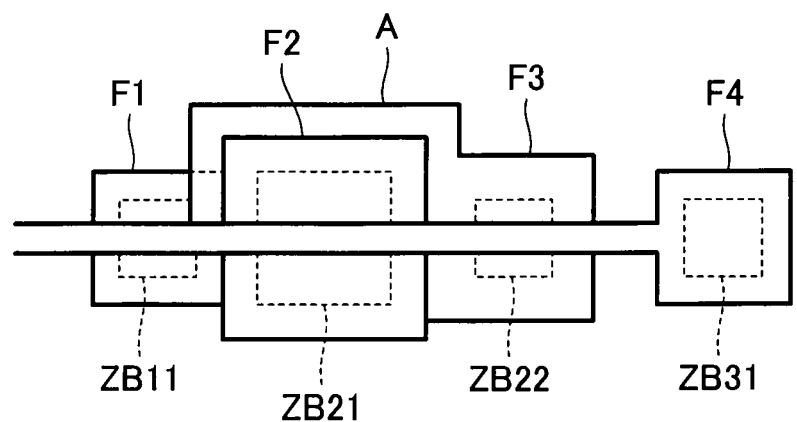
FIG. 18 is a plan view of part of the nonvolatile memory according to the same embodiment.

The via-holes ZB21, ZB22 are formed in the same step but connected to the bit lines BLL2, BLL3 in different layers. Therefore, the bit line BLL3 in the upper layer has a detour of wiring A from an end thereof to the fringe F3 as shown in a plane pattern of FIG. 18 to avoid the interference with the via-hole ZB21 connected to the bit line BLL2 in the lower layer.

With such the arrangement, formation of the via-holes through the upper layers requires only 3 steps for 3 layers L23, L45, L6, which can reduce the steps sharply.

In the present embodiment, formation of each via-hole is begun from a position lower than the lower end of the memory cell MC in the upper layer. Accordingly, on formation of the via-hole, it is prevented from damaging the memory cell MC in the upper layer as long as possible.

[Manufacturing Method in First Embodiment]

In manufacture of the above-described memory according to the present embodiment, first, on the silicon substrate 51, an interlayer insulator 52 is formed and a lower layer line is formed. Thereafter, the memory cell array layers MA1-MA4 are formed to form a cell array block. At the same time, after the first cell array MA1 is formed, and after the insulator is formed, the via-holes in the second/third layer L23 are formed. In addition, after the second and third cell array layers MA2, MA3 are formed, and after the insulator is formed, the via-holes in the fourth/fifth layer L45 are formed. Further, after the fourth cell array layer MA4 is formed, and after the insulator is formed, the via-holes in the sixth layer L6 are formed.

[Second Embodiment]

Figure 19:
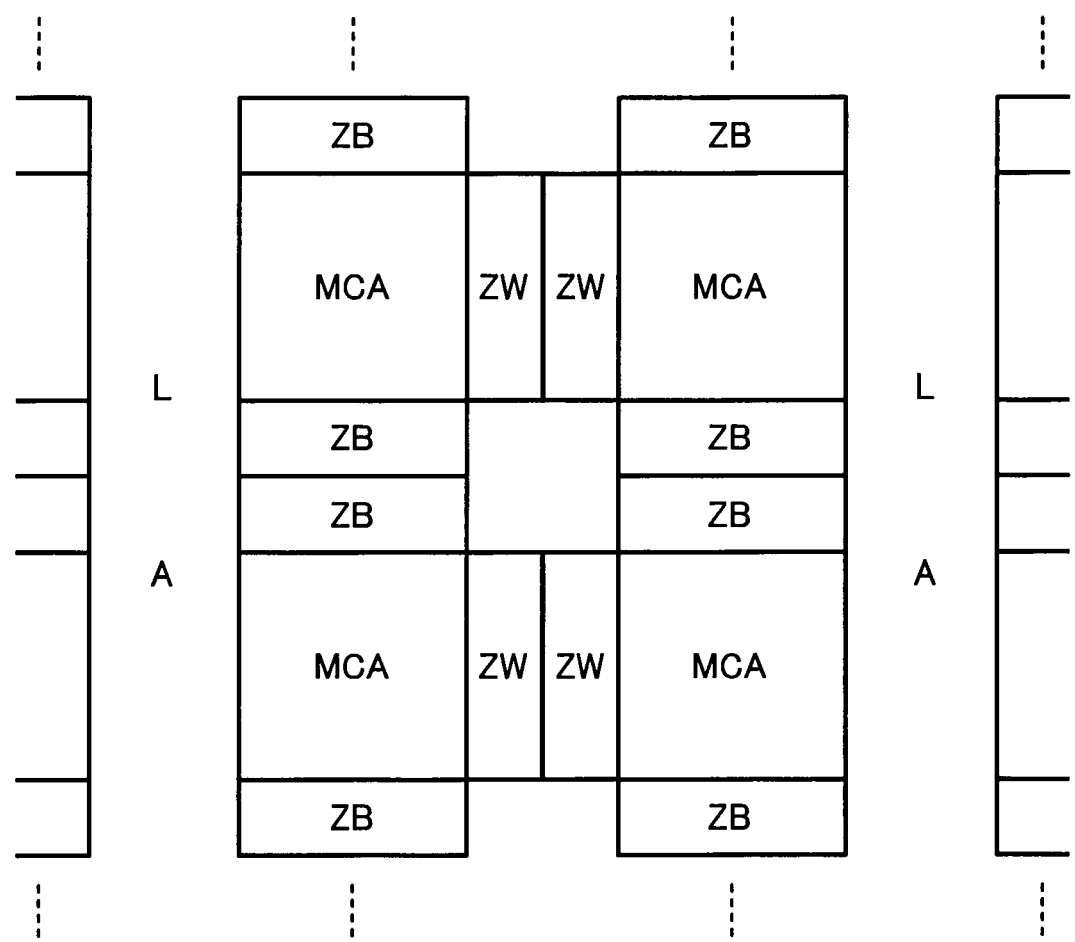
FIG. 19 is a plan view of the major part of a memory cell in a nonvolatile memory according to a second embodiment of the present invention.

In the above-described embodiment, the leads of the word line WL and the bit line BL are led out to both ends of the memory block. If plural cell array blocks MCA are arranged in matrix as shown in FIG. 19, though, then bit-line lead regions ZB are provided on both sides of the cell array block MCA while word-line leads ZW are provided on a single side of the cell array block MCA.

Such the arrangement leaves space at the side on which no word-line lead ZW of the cell array block MCA is formed. Accordingly, this space can be used as wiring space LA to the semiconductor substrate.

[Other Embodiments]

The present invention is not particularly limited to the structure of the memory cell but rather can be applied to various multi-layered memories of the cross point type such as a phase change memory element, an MRAM element, a PFRAM, and a ReRAM.

What is claimed is:

1. A nonvolatile semiconductor memory device, comprising:
    a semiconductor substrate;
    a cell array block formed on said semiconductor substrate and including plural stacked cell array layers each with a plurality of first lines, a plurality of second lines crossing said plurality of first lines, and memory cells connected at intersections of said first and second lines between both lines; and
    a plurality of via-holes each extending in the stacked direction of said cell array layers to individually connect said first or second line in said each cell array layer to said semiconductor substrate,
    wherein each via-hole is formed continuously through said plural stacked cell array layers, said first or second lines include a step portion as a discontinuous change in width of cross-section in a stacked direction of said cell array layers where said first or second lines are connected to said via-holes, said first or second lines extending continuously to opposite sides of said via-holes, and multiple via-holes having equal lower end positions and upper end positions are connected to said first or second lines in different cell array layers.

2. The nonvolatile semiconductor memory device according to claim 1, wherein said first or second line connected to said via-hole is formed in a detour pattern keeping out of said via-hole connected to said first or second line in a lower layer.

3. The nonvolatile semiconductor memory device according to claim 1, wherein the upper end position of said via-hole locates lower than the lower end position of said memory cell in an upper cell array layer.

4. The nonvolatile semiconductor memory device according to claim 2, wherein the upper end position of said via-hole locates lower than the lower end position of said memory cell in an upper cell array layer.

5. The nonvolatile semiconductor memory device according to claim 1, said memory cell including
    a variable resistor operative to store information in accordance with the variation in resistance, and
    a non-ohmic element serially connected to said variable resistor and stacked thereon.

6. The nonvolatile semiconductor memory device according to claim 2, said memory cell including
    a variable resistor operative to store information in accordance with the variation in resistance, and
    a non-ohmic element serially connected to said variable resistor and stacked thereon.

7. The nonvolatile semiconductor memory device according to claim 3, said memory cell including
    a variable resistor operative to store information in accordance with the variation in resistance, and
    a non-ohmic element serially connected to said variable resistor and stacked thereon.

8. The nonvolatile semiconductor memory device according to claim 7, wherein said variable resistor comprises a composite compound containing cations of a transition element and varies the resistance in accordance with migration of said cations.

9. The nonvolatile semiconductor memory device according to claim 7, wherein said non-ohmic element is a diode.

10. The nonvolatile semiconductor memory device according to claim 1, wherein the device is manufactured by:
    forming plural cell array layers in multiple layers on a semiconductor substrate to form a cell array block, each cell array layer including a plurality of first lines, a plurality of second lines crossing said plurality of first lines, and memory cells connected at intersections of said first and second lines between both lines;

forming penetrated holes simultaneously, together with formation of said cell array block, after formation of plural cell array layers, said penetrated holes penetrating said plural cell array layers and penetrating said first or second lines in different cell array layers; and filling said simultaneously formed penetrated holes with a conductive material, thereby forming a plurality of via-holes each extending in the stacked direction of said cell array layers to individually connect said first or second line in said each cell array layer to said semiconductor substrate.

11. The nonvolatile semiconductor memory device according to claim 10, wherein said penetrated hole is formed from the lower end position of said cell array layer to the upper end position of another cell array in a lower layer.

12. The nonvolatile semiconductor memory device according to claim 10, further comprising forming a via penetration hole through said first or second line through which said penetrated hole penetrates, before formation of said penetrated hole.

13. The nonvolatile semiconductor memory device according to claim 10, wherein the formation of said cell array block includes forming said first or second line connected to said via-hole in a detour pattern keeping out of said via-hole connected to said first or second line in a lower layer.

14. The nonvolatile semiconductor memory device according to claim 10, wherein the formation of said cell array block includes forming said memory cell, which includes a variable resistor operative to store information in accordance with the variation in resistance, and a non-ohmic element serially connected to said variable resistor and stacked thereon.

15. The nonvolatile semiconductor memory device according to claim 10, wherein said via-holes penetrating said first or second lines are formed only on one side of said cell array block.

* * * * *